United States Patent [19]

Nöther

[11] 4,271,443
[45] Jun. 2, 1981

[54] QUENCH DETECTOR

[75] Inventor: Gernot Nöther, Karlsruhe, Fed. Rep. of Germany

[73] Assignee: Kernforschungszentrum Karlsruhe, Karlsruhe, Fed. Rep. of Germany

[21] Appl. No.: 73,487

[22] Filed: Sep. 7, 1979

[30] Foreign Application Priority Data

Sep. 13, 1978 [DE] Fed. Rep. of Germany ....... 2839787

[51] Int. Cl.³ .............................................. H02H 3/28
[52] U.S. Cl. ...................................... 361/19; 307/306
[58] Field of Search ....................... 361/19, 141, 1, 42; 307/306, 245; 323/44 F; 363/14

[56] References Cited

U.S. PATENT DOCUMENTS

| 3,304,466 | 2/1967 | Minnich et al. | 361/19 |
| 3,579,035 | 5/1971 | Burnier et al. | 361/19 |

OTHER PUBLICATIONS

Journal of Applied Physics-vol. 42, No. 1; Jan.-1971; by D. H. Lester, "Constant Voltage Controller and Transition Monitor for Superconducting Magnets."
"Loss Measurements in Superconducting Magnetic Energy Storage Coils", Lindsay et al., Los Alamos Scientific Laboratory, LA-6790-MS; May 1977.

Primary Examiner—Patrick R. Salce
Attorney, Agent, or Firm—Spencer & Kaye

[57] ABSTRACT

A quench detector for monitoring a tapped superconducting coil for changes in its conductivity and also for monitoring the integrity of the measuring leads connected to the coil. The quench detector comprises a bridge circuit including first and second resistance means having a junction therebetween connected to a first measuring point, the other ends of the first and second resistance means being connected to corresponding opposite ends of the superconducting coil. The first and second coil elements on either side of the tap of the superconducting coil and the first and second resistance means form the first branch of the bridge circuit.

The second branch of the bridge circuit consists of third and fourth resistance means, each having one end connected to a second measuring point and its other end connected to the tap on the superconducting coil. The resistance of the second branch corresponds to the real or resistive, component of the impedance of the firsh branch of the bridge circuit.

An operational amplifier is provided which has its first and second inputs coupled to the first and second measuring points respectively and its output coupled to the first measuring point through a fifth resistance means constituting the third branch of the bridge circuit. A sixth resistance means constituting the fourth branch of the bridge circuit is coupled between a source of test voltage and the second measuring point.

8 Claims, 5 Drawing Figures

QUENCH DETECTOR

BACKGROUND OF THE INVENTION

The present invention relates to a quench detector for detecting changes in the conductivity of a superconducting coil and for monitoring the integrity of the leads connected to the coil to determine whether they have become open or short circuited.

In superconducting magnets, local increases in the magnetic field or movement of the conductor produces normally conducting, or resistive, regions in the coil. Due to the heating associated therewith, these undesired, normally conducting, resistive regions may rapidly spread throughout the entire magnet. After such a transition, the energy supply must be interrupted as quickly as possible and the current reduced to zero to prevent the entire magnet from being damaged or destroyed as a result of its being driven into the normal state. The reliable operation of a superconducting magnet therefore requires the early detection of a transition to normal conduction.

Quench detectors are known in which the superconducting coil is divided by a center tap into two coil elements which form part of a bridge circuit for monitoring the coil. A disadvantage of these known devices is that a break in one or more of the measuring leads connected to the superconducting coil being monitored cannot be detected. Consequently, a transition to normal conduction in one partial region of the superconducting coil will not be detected early enough to prevent with sufficient certainty the destruction of the coil.

It is an object of the present invention to provide a quench detector having a reliability which is substantially increased over those of the prior art thereby also improving the operating reliability of the superconducting coil being monitored.

SUMMARY OF THE INVENTION

In accordance with the present invention, a quench detector is provided for monitoring a superconducting coil for changes in its conductivity and also for monitoring the integrity of the measuring leads connected to the coil. The quench detector comprises a bridge circuit including first and second resistance means having a junction therebetween connected to a first measuring point, the other ends of the first and second resistance means being connected to corresponding opposite ends of the superconducting coil. The first and second coil elements on either side of the tap of the superconducting coil and the first and second resistance means form the first branch of the bridge circuit.

The second branch of the bridge circuit consists of third and fourth resistance means, each having one end connected to a second measuring point and its other end connected to the tap on the superconducting coil. The resistance of the second branch corresponds to the real, or resistive, component of the impedance of the first branch of the bridge circuit.

An operational amplifier is provided which has its first and second inputs coupled to the first and second measuring points, respectively, and its output coupled to the first measuring point through a fifth resistance means constituting the third branch of the bridge circuit. A sixth resistance means constituting the fourth branch of the bridge circuit is coupled between a source of test voltage and the second measuring point.

The present invention is advantageous in that not only are changes in the resistances of the elements of the superconducting coil detected but also malfunctions in the measuring circuit, such as interruptions, short-circuits and improper operation of the operational amplifier. Should any of these resistance changes or malfunctions occur, the monitoring device is switched off.

DESCRIPTION OF THE PREFERRED EMBODIMENTS

Figure 1:
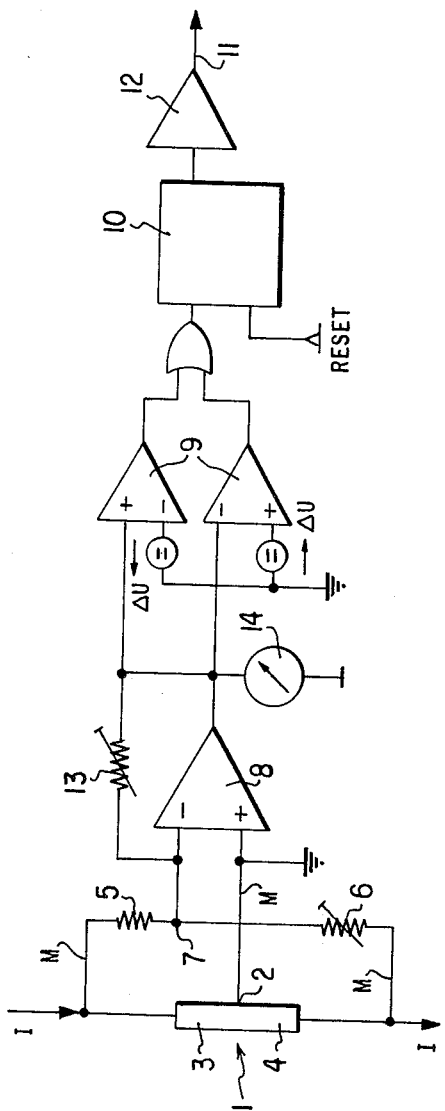
FIG. 1 is a schematic diagram showing a quench detector of a type known in the prior art.

A prior art quench detector which permits the detection of normally conductive zones in superconducting magnets is shown in FIG. 1. This detector employs a bridge circuit which includes a superconducting coil 1 having two identical coil elements 3 and 4 separated by a center tap 2, a fixed resistor 5 and a variable resistor 6 joined to the fixed resistor 5 at a junction 7. Resistor 6 is made variable to permit compensation of any asymmetry in the coil elements 3 and 4.

The negative input of an operational amplifier 8 is connected to the junction 7 and the grounded positive input of amplifier 8 is connected to the tap 2 of the superconducting coil 1. A variable feedback resistor 13 is connected between the negative input and output of amplifier 8 and a voltmeter 14 is connected between the output of the amplifier and ground.

The output of operational amplifier 8 is also connected to a window discriminator 9 comprising two operational amplifiers, working as comparators, two reference voltage sources and an or-gate. If the output-voltage of the bridge-amplifier rises over $+\Delta U$, the upper comparator switches and triggers the or-gate. If the output voltage sinks below $-\Delta U$, the lower comparator switches and triggers the or-gate likewise. For a voltage between limits of $+\Delta U$ and $-\Delta U$ all elements persists in quiescent state.

A flip-flop 10 connects the output of the window discriminator 9 to an output terminal 11 through an output amplifier 12. When a signal appears at output terminal 11 it is coupled to the power source (not shown) which excites the superconducting coil 1 and switches it off.

The power source generates a direct current I slowly increasing from zero to its rated value which divides between the superconducting coil 1 and the resistors 5 and 6. When coil 1 is in its superconducting state, the coil elements 3 and 4 are purely inductive and the voltages thereacross are equal in magnitude and in phase, as are the voltages across resistors 5 and 6. Accordingly, the voltage across the bridge between the center tap 2 and point 7 is zero.

Upon the occurrence of a normally conducting region in one of the coil elements 3 or 4, the current through superconducting coil 1 is no longer in quadrature with the current through resistors 3 and 4 due to the resistive component introduced by the normally conducting region of the superconductor. Accordingly, an output voltage is generated between junction 7 and tap 2.

This output voltage is amplified by operational amplifier 8 and then coupled to the input of the window discriminator 9. As a function of the side where the normal conducting region arises, the voltage crosses upper or lower edges of the window. The comparator switches and flip-flop 10 is triggered by means of or-gate and a signal generated at the output 11 of output amplifier 12 which causes the superconducting coil 1 to be switched off.

A break or short-circuit in the measuring leads M connected to the superconducting coil 1 triggers the quench detector of FIG. 1 only if there is a change in the load current I and after a considerable delay. Therefore, the occurrence of a normally conducting region may remain unnoticed resulting in the damage or destruction of the superconducting coil.

Figure 2:
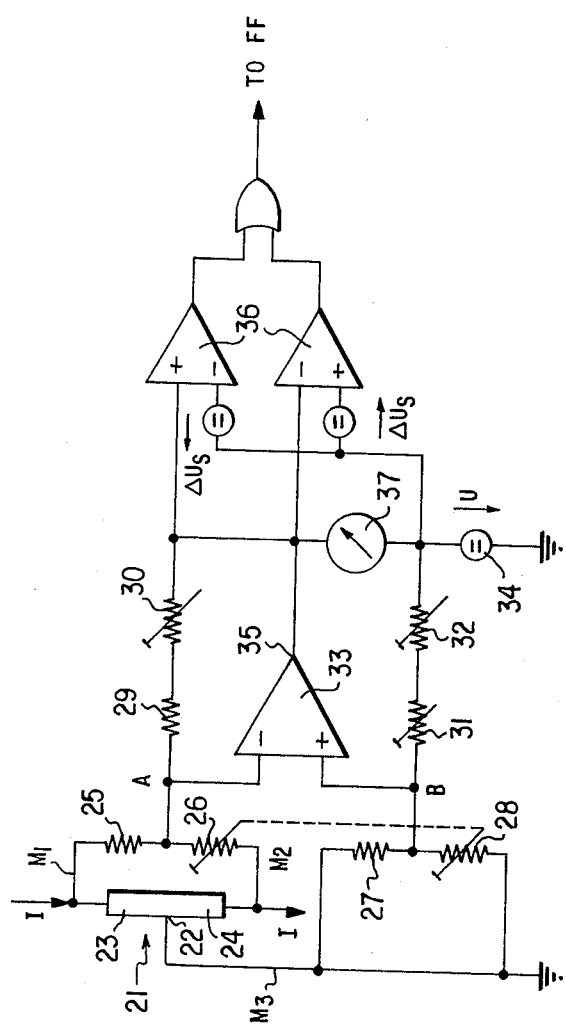
FIG. 2 is a schematic diagram of a quench detector in accordance with the present invention.

This disadvantage is overcome by the quench detector shown in the schematic diagram of FIG. 2. Using this circuit, the occurrence of normally conducting zones in the superconducting coil can be detected together with interruptions and short circuits in the measuring leads and malfunctions in the amplifier. Detection of any one of these conditions causes the superconducting coil to be switched off.

Referring to FIG. 2, a superconducting coil 21 is divided into coil elements 23 and 24 by a tap 22. A fixed resistor 25 and a variable resistor 26 each have one end connected to a measuring point A and their other ends connected to the ends of the superconducting coil 21 by leads $M_1$ and $M_2$ respectively. The coil elements 23, 24 and the resistors 25, 26 comprise the first branch of a bridge circuit.

The second branch of the bridge circuit consists of a fixed resistor 27 and a variable resistor 28 each having one end connected to a measuring point B and their other ends connected by lead $M_3$ to the tap 22 of the superconducting coil 21. The resistance of the second branch of the bridge circuit corresponds to the real, i.e. resistive component, of the impedance of the first branch of the bridge circuit.

An operational amplifier 33 has its negative input connected to measuring point A and its positive input connected to measuring point B. The third branch of the bridge circuit, consisting of fixed resistor 29 and variable resistor 30, is connected between point A and the output 35 of the operational amplifier. The fourth branch of the bridge circuit consists of variable resistors 31 and 32 which are connected to measuring point B and to a source of testing voltage 34. A moving coil voltage measuring device 37 is connected between the output 35 of the operational amplifier 33 and the junction of variable resistor 32 and test voltage source 34. Variable resistors 26 and 28 are mechanically interlocked so that they may be simultaneously adjusted, as are variable resistors 30 and 32.

The output of operational amplifier 33 is coupled to a window discriminator 36 which comprises two comparators, two reference-voltage sources and an or-gate. The edge-voltages of window are $U+\Delta U$ and $U-\Delta U$. If the output voltage of the bridge-amplifier crosses an edge of the window, the comparator triggers a flip-flop not shown by means of or-gate. The flip-flop switches off the power supply of superconducting coil by means of an output-amplifier.

When the resistances of resistors 30 and 32 as well as the resistances of resistors 26 and 28 are equal to each other, no normal conducting regions are present in the superconducting coil 21 and the measuring leads $M_1$, $M_2$ and $M_3$ are neither open nor short-circuited, a voltage equal to testing voltage U is generated between the output 35 of the operational amplifier and ground. Thus, the operational amplifier 33 is included in the monitoring process, the voltage across voltmeter 37 being zero under these conditions.

The setting of the resistances is simplified by mechanically coupling resistors 26 and 28 and mechanically coupling resistors 30 and 32. The variable resistor 31 permits correction of any deviations which may occur in the synchronism of the setting devices of the variable resistors 26, 28, 30 and 32.

In the event of a quench; that is, if a portion of the superconducting coil should become normally conducting, the operational amplifier acts as an inverting amplifier for bridge output voltage having a gain of either $(R30+R29)/R26$ or $(R30+R29)/R25$, depending upon which of the coil elements 23 or 24 of the superconducting coil 21 has become normally conductive. This causes a shifting of output voltage out of permissible range of the window-discriminator. The flip-flop is triggered and power supply is switched off.

When one of the measuring leads $M_1$, $M_2$ or $M_3$ becomes open-circuited, the voltage between the output 35 of operational amplifier 33 and ground differs from testing voltage. By a suitable selection of the amplifier gain, of the width of the window $2\Delta U$ and of the bridge supply voltage U, a normally conducting region in the superconducting coil 21 as well as a break or short-circuit in the measuring leads $M_1$–$M_3$ or a malfunction of amplifier 33 will produce a sufficiently large shift of the voltage across the output of the operational amplifier 33 to result in the power source to the superconducting coil 21 being switched off.

When the quench detector is matched for the first time to a superconducting coil 21, the coil is operated with a small current having a sawtooth waveform, and a minimum gain initially introduced by adjustment of resistors 30 and 32. Resistors 26 and 28 are then set so that the deflection of the voltmeter 37 is zero, any additional zero correction required being effected by adjustment of resistor 31. The amplifier gain is then increased in steps by means of resistors 30 and 32 and the subsequent matching steps repeated until the maximum gain has been reached. Because the resistors 26, 28 and 30, 32 are mechanically coupled, the bridge circuit is always maintained in a matched state and the settings can be made independently of one another.

Figure 3:
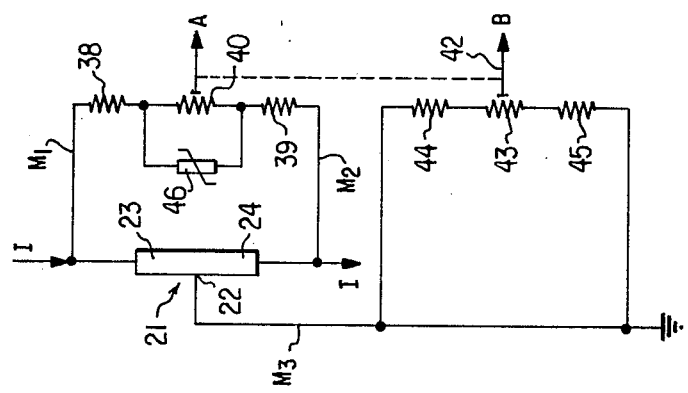
FIG. 3 shows a modification of the input circuit of the quench detector of FIG. 2.

Referring to FIG. 3, an embodiment of the invention is shown wherein a potentiometer 40, resistors 38, 39 and a varistor 46 are substituted for resistors 25 and 26 of FIG. 2. Further, a potentiometer 43 and resistors 44, 45 are substituted for resistors 27 and 28. The varistor 46 is connected in parallel with potentiometer 40 and this parallel combination of resistors connected in series with resistors 38 and 39 which are coupled to opposite ends of semiconductor coil 21 by leads $M_1$ and $M_2$ respectively. Resistors 44 and 45 are connected to opposite ends of potentiometer 43 and to tap 22 of superconducting coil 21 by lead $M_3$. The taps 41, 42 on potentiometers 40, 43 respectively, are mechanically interlocked and are electrically connected to measuring points A and B respectively.

The effect of inaccuracies due to synchronism between the variable resistors is reduced by the configuration shown in FIG. 3. In this arrangement, potentiometer 40 has a substantially lower resistance value than the limiting resistors 38 and 39 and potentiometer 43 has a substantially lower resistance than resistors 44 and 45. The varistor 46 connected in parallel with potentiometer 40 acts as a transient voltage suppressor and is for the purpose of preventing an excessive voltage from developing across potentiometer 40.

Figure 4:
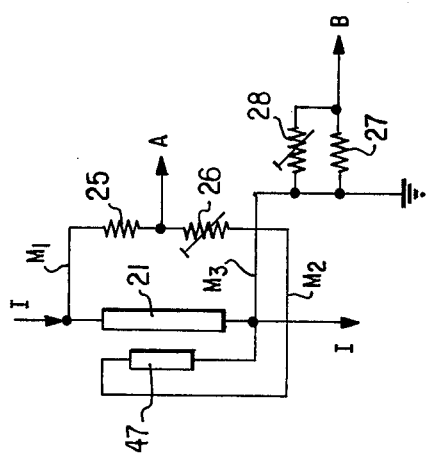
FIG. 4 illustrates another modification of the quench detector of FIG. 2 employing a normally conducting coupling coil.

It is not always possible to apply a tap to the superconducting coil 21. Under these conditions, a bridge circuit can be established by closely coupling a normally conducting coil 47 to superconducting coil 21 as shown in FIG. 4. That is, coil 47 is magnetically coupled to superconducting coil 21 and also electrically coupled to coil 21 and resistor 26, the junction between resistors 25 and 26 being connected to point A as in FIG. 2, the junction between coils 21 and 47, and resistors 27 and 28 being connected to point $M_3$ and the junction between resistors 27 and 28 connected to point B. On the assumption that resistors 25 to 28 have relatively high resistances and only low current flows in coil 47, the voltage of this coil is in phase to voltage of main coil. The combination of coil 21 and coil 47 has the same behavior as a superconducting coil with a tap and is fitted into a bridge as formerly described.

Figure 5:
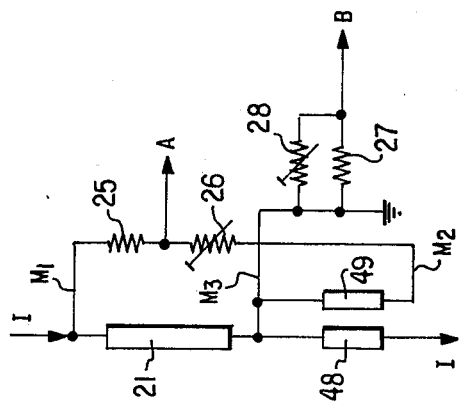
FIG. 5 shows still another modification of the invention employing a series-connected air core transformer.

Another embodiment of the invention which may be used when the superconducting coil 21 does not have a tap is shown in FIG. 5. In FIG. 5, the current I through coil 21 also flows through the primary winding 48 of an air core transformer having a secondary winding 49 coupled between the junction of coil 21 and the primary winding 48 and resistor 26. The junction between resistors 25 and 26 is connected to point A as in FIG. 2, the junction of coil 21, primary winding 48 and secondary winding 49 and resistors 27 and 28 are connected to point $M_3$ and the juction between resistors 27 and 28 is connected to point B.

On the assumption that resistors 25 to 28 have relatively high resistance and only low current flows in coil 49, the voltage across the coil is purely inductive and in phase with the voltage of main coil 21. The voltage across coil 48 is also resistive and not in phase with the voltage of main coil. The combination of coils 21 and 49 has the same behavior as a superconducting coil with a tap. The only difference between FIG. 5 and FIG. 4 is the coupling of compensation coil 49 to magnetic field of the auxiliary coil 48 and not to field of main coil.

It will be understood that the above description of the present invention is susceptible to various modifications, changes and adaptations, and the same are intended to be comprehended within the meaning and range of equivalents of the appended claims.

What is claimed is:

1. A quench detector for monitoring a superconducting coil for changes in its conductivity and for monitoring the leads connected to said coil, said superconducting coil being divided into first and second coil elements by a tap located between said coil elements, comprising first and second resistance means, each having means coupling one end to a first measuring point, the other ends of each of said first and second resistance means being connected to corresponding opposite ends of said superconducting coil, the first and second coil elements of said superconducting coil and said first and second resistance means forming the first branch of a bridge circuit;

third and fourth resistance means, each having means coupling one end to a second measuring point, the other ends of each of said third and fourth resistance means being connected to the tap on said superconducting coil, said third and fourth resistance means forming the second branch of said bridge circuit having a resistance corresponding to the resistive component of the impedance of said first branch;

an operational amplifier having first and second inputs coupled to said first and second measuring points, respectively;

fifth resistance means coupled between the output of said operational amplifier and said first measuring point to form the third branch of said bridge circuit; and sixth resistance means coupled between a source of test voltage and said second measuring point to form the fourth branch of said bridge circuit.

2. A quench detector as defined by claim 1 wherein said second and fourth resistance means are variable and mechanically coupled to permit simultaneous setting thereof.

3. A quench detector as defined by claim 1 or 2 wherein said fifth resistance means comprises a fixed resistor and a variable resistor connected in series and said sixth resistance means comprises a pair of series-connected variable resistors, the variable resistor of said fifth resistance means and one of the variable resistors of said sixth resistance means being mechanically coupled to permit simultaneous setting thereof.

4. A quench detector as defined by claim 1 wherein the means coupling said first and second resistance means to said first measuring point comprises a first potentiometer having its ends connected to said first and second resistance means and a movable brush connected to said first measuring point, and the means coupling said third and fourth resistance means to said second measuring point comprises a second potentiometer having its ends connected to said third and fourth resistance means and a movable brush connected to said second measuring point, the movable brushes on said first and second potentiometers being mechanically coupled to permit simultaneous setting thereof.

5. A quench detector as defined by claim 4 which further comprises a varistor connected in parallel with said first potentiometer, said varistor protecting said first potentiometer against the generation of excessive voltages thereacross.

6. A quench detector for monitoring a superconducting coil for changes in its conductivity and for monitoring the leads connected to said coil, comprising first and second resistance means, each having means coupling one end to a first measuring point, the other ends of each of said first and second resistance means being connected to corresponding opposite ends of said superconducting coil, inductive means connected between one end of said superconducting coil and said second resistance means, the junction between said inductive means and said superconducting coil being coupled to a second measuring point;

an operational amplifier having first and second inputs coupled to said first and second measuring points respectively;

fifth resistance means coupled between the output of said operational amplifier and said first measuring point; and sixth resistance means coupled between a source of test voltage and said second measuring point.

7. A quench detector as defined by claim 6 wherein said inductive means comprises a normally conducting coil magnetically coupled to said superconducting coil.

8. A quench detector as defined by claim 6 wherein said inductive means comprises an air-core transformer having primary and secondary windings.

* * * * *